United States Patent
Liu et al.

(10) Patent No.: US 11,551,927 B2
(45) Date of Patent: *Jan. 10, 2023

(54) HIGH ELECTRON MOBILITY TRANSISTOR (HEMT) HAVING AN INDIUM-CONTAINING LAYER AND METHOD OF MANUFACTURING THE SAME

(71) Applicant: TAIWAN SEMICONDUCTOR MANUFACTURING COMPANY, LTD., Hsinchu (TW)

(72) Inventors: Po-Chun Liu, Hsinchu (TW);
Chung-Chieh Hsu, Hsinchu (TW);
Chi-Ming Chen, Zhubei (TW);
Chung-Yi Yu, Hsinchu (TW);
Chen-Hao Chiang, Jhongli (TW);
Min-Chang Ching, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 143 days.

This patent is subject to a terminal disclaimer.

(21) Appl. No.: 17/089,147

(22) Filed: Nov. 4, 2020

(65) Prior Publication Data
US 2021/0050209 A1 Feb. 18, 2021

Related U.S. Application Data

(63) Continuation of application No. 14/182,847, filed on Feb. 18, 2014, now Pat. No. 10,867,792.

(51) Int. Cl.
*H01L 29/778* (2006.01)
*H01L 21/02* (2006.01)
(Continued)

(52) U.S. Cl.
CPC ...... *H01L 21/0254* (2013.01); *H01L 21/0251* (2013.01); *H01L 21/0262* (2013.01);
(Continued)

(58) Field of Classification Search
None
See application file for complete search history.

(56) References Cited

U.S. PATENT DOCUMENTS

| 5,610,410 A | 3/1997 | Imanishi |
| 6,867,078 B1 | 3/2005 | Green et al. |

(Continued)

*Primary Examiner* — Benjamin P Sandvik
(74) *Attorney, Agent, or Firm* — Hauptman Ham, LLP

(57) ABSTRACT

A high electron mobility transistor includes: a first semiconductor layer over a substrate, and a second semiconductor layer over the first semiconductor layer, the second semiconductor layer having a band gap discontinuity with the first semiconductor layer, and at the first semiconductor layer and/or the second conductive layer includes indium. A top layer is over the second semiconductor layer, and a metal layer is over, and extends into, the top layer, the top layer separating the metal layer from the second semiconductor layer. A gate electrode is over the top layer, a third semiconductor layer being between the gate electrode and the top layer, where a sidewall of the third semiconductor layer and a sidewall of the metal layer are separated. A source and drain are on opposite sides of the gate electrode, the top layer extending continuously from below the source, below the gate electrode, and below the drain.

20 Claims, 12 Drawing Sheets

(51) Int. Cl.
  *H01L 29/66*  (2006.01)
  *H01L 29/45*  (2006.01)
  *H01L 29/20*  (2006.01)
  *H01L 29/205*  (2006.01)
  *H01L 29/201*  (2006.01)
  *H01L 29/10*  (2006.01)
  *H01L 29/207*  (2006.01)

(52) U.S. Cl.
  CPC ...... *H01L 21/02458* (2013.01); *H01L 29/454* (2013.01); *H01L 29/66462* (2013.01); *H01L 29/7786* (2013.01); *H01L 29/1066* (2013.01); *H01L 29/201* (2013.01); *H01L 29/2003* (2013.01); *H01L 29/205* (2013.01); *H01L 29/207* (2013.01)

(56) References Cited

U.S. PATENT DOCUMENTS

| | | | |
|---|---|---|---|
| 8,866,192 | B1 | 10/2014 | Chen et al. |
| 8,901,609 | B1 | 12/2014 | Chen et al. |
| 9,093,511 | B2 | 7/2015 | Chen et al. |
| 10,867,792 | B2 * | 12/2020 | Liu .................. H01L 21/02458 |
| 2004/0155260 | A1 | 8/2004 | Kuzmik |
| 2005/0023535 | A1 | 2/2005 | Sriram |
| 2006/0255364 | A1 | 11/2006 | Saxler et al. |
| 2007/0269968 | A1 | 11/2007 | Saxler et al. |
| 2009/0045438 | A1 | 2/2009 | Inoue et al. |
| 2009/0078966 | A1 | 3/2009 | Asai et al. |
| 2009/0283756 | A1 | 11/2009 | Hellings et al. |
| 2010/0068855 | A1 | 3/2010 | Saxler et al. |
| 2011/0193135 | A1 | 8/2011 | Hagleitner et al. |
| 2012/0139038 | A1 | 6/2012 | Imanishi et al. |
| 2012/0205667 | A1 | 8/2012 | Simin et al. |
| 2013/0069114 | A1 | 3/2013 | Simin et al. |
| 2013/0075751 | A1 | 3/2013 | Imanishi |
| 2014/0027779 | A1 | 1/2014 | Hwang et al. |
| 2014/0092638 | A1 | 4/2014 | Nishimori et al. |
| 2014/0094223 | A1 | 4/2014 | Dasgupta et al. |
| 2014/0097470 | A1 | 4/2014 | Kim et al. |
| 2014/0159117 | A1 | 6/2014 | Taniguchi et al. |
| 2014/0252369 | A1 | 9/2014 | Lee et al. |
| 2015/0041860 | A1 | 2/2015 | Nishimori et al. |
| 2016/0141404 | A1 | 5/2016 | Tsai et al. |
| 2018/0204928 | A1 | 7/2018 | Nakata |

* cited by examiner

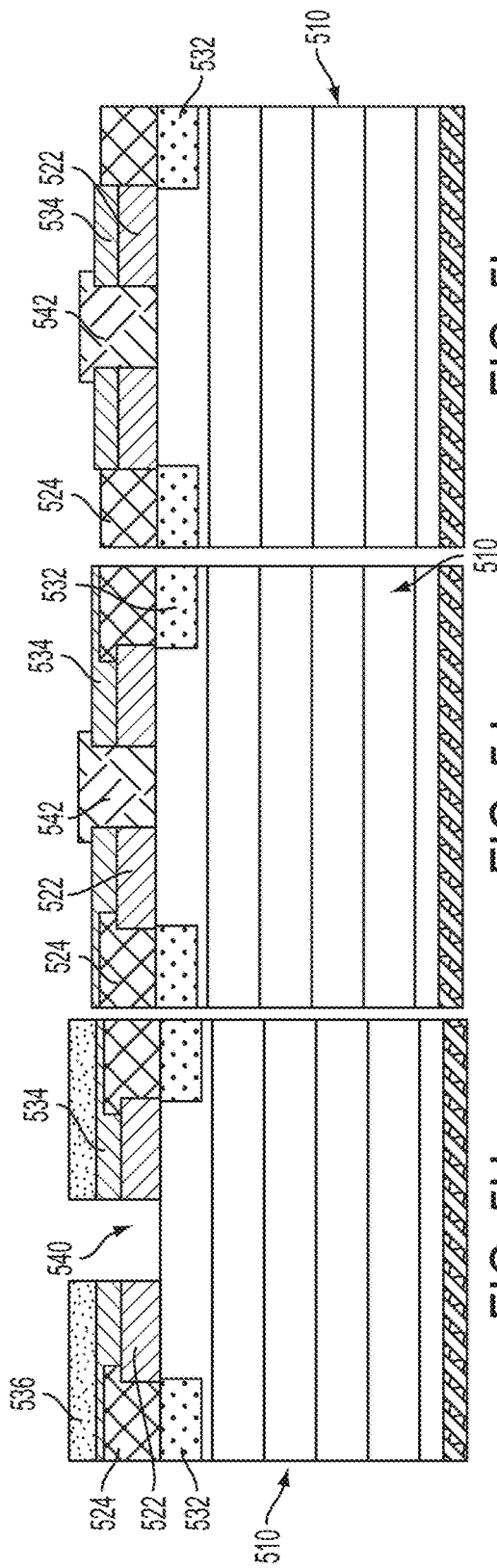

HIGH ELECTRON MOBILITY TRANSISTOR (HEMT) HAVING AN INDIUM-CONTAINING LAYER AND METHOD OF MANUFACTURING THE SAME

PRIORITY CLAIM

The present application is a continuation of U.S. application Ser. No. 14/182,847, filed Feb. 18, 2014, which is incorporated herein by reference in its entirety.

RELATED APPLICATIONS

The instant application is related to the following U.S. patent applications:
U.S. patent application Ser. No. 13/944,713; filed Jul. 17, 2013, now U.S. Pat. No. 9,093,511, issued Jul. 25, 2015;
U.S. patent application Ser. No. 13/944,494; filed Jul. 17, 2013, now U.S. Pat. No. 8,901,609, issued Dec. 2, 2014; and
U.S. patent application Ser. No. 13/944,625; filed Jul. 17, 2013, now U.S. Pat. No. 8,866,192, issued Oct. 21, 2104.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The drawings, which are incorporated herein, include the following in which:

FIGS. 5A-5L are cross-sectional views of an HEMT at various stages of production in accordance with one or more embodiments;

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
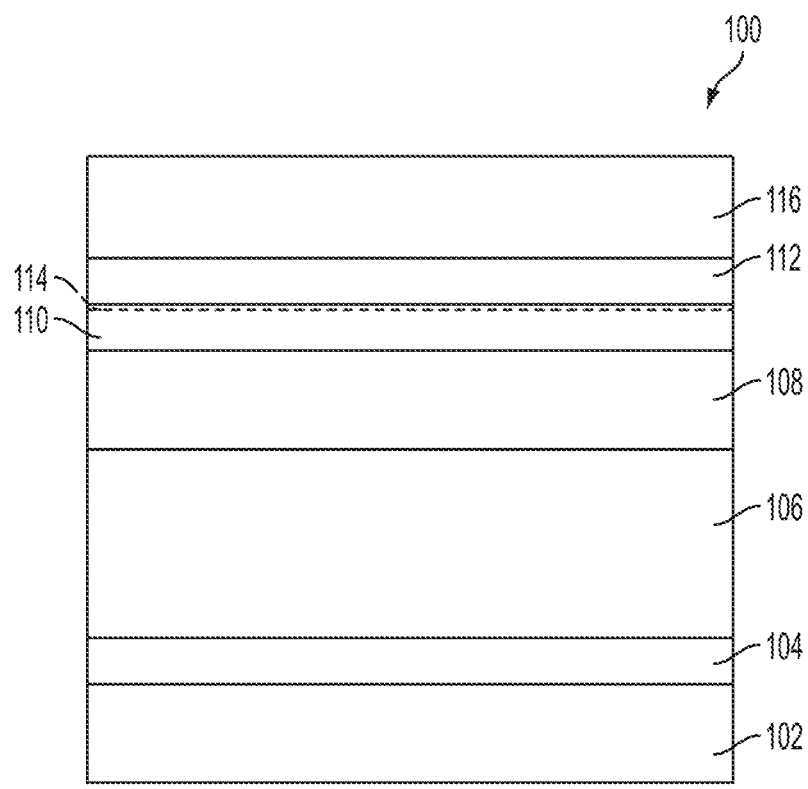
FIG. 1 is a cross-sectional view of a high electron mobility transistor (HEMT) structure in accordance with one or more embodiments.

FIG. 1 is a cross-sectional view of a high electron mobility transistor (HEMT) structure 100 in accordance with one or more embodiments. HEMT structure 100 includes a substrate 102. A seed layer 104 is over substrate 102. In some embodiments, seed layer 104 includes multiple layers. A graded layer 106 is over seed layer 104. A buffer layer 108 is over graded layer 106. A channel layer 110 is over buffer layer 106. An active layer 112 is over channel layer 110. Due to a band gap discontinuity between channel layer 110 and active layer 112, a two dimensional electron gas (2-DEG) 114 is formed in the channel layer near an interface with the active layer. A top layer 116 is over active layer 112.

Substrate 102 acts as a support for HEMT structure 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure. In some embodiments, substrate 102 is doped.

Seed layer 104 helps to compensate for a mismatch in lattice structures between substrate 102 and graded layer 106. In some embodiments, seed layer 104 includes multiple layers. In some embodiments, seed layer 104 includes a same material formed at different temperatures. In some embodiments, seed layer 104 includes a step-wise change in lattice structure. In some embodiments, seed layer 104 includes a continuous change in lattice structure. In some embodiments, seed layer 104 is formed by epitaxially growing the seed layer on substrate 102.

In at least one example, seed layer 104 includes a first layer of aluminum nitride (AlN) and a second layer of AlN over the first layer of AlN. The second layer of AlN is formed at a high temperature, ranging from about 1000° C. to about 1300° C., and has a thickness ranging from about 50 nanometers (nm) to about 200 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The first layer of AlN is formed at a low temperature, ranging from about 900° C. to about 1000° C., and has a thickness ranging from about 20 nm to about 80 nm. The lower temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

Graded layer 106 provides additional lattice matching between seed layer 104 and buffer layer 108. In some embodiments, graded layer 106 is doped with p-type dopants to reduce the risk of electron injection from substrate 102. Electron injection occurs when electrons from substrate 102 diffuse into channel layer 108. By including p-type dopants, the electrons are trapped by the positively charged dopants and do not negatively impact performance of 2-DEG 114 in channel layer 110. In some embodiments, the p-type dopant concentration in graded layer 106 is greater than or equal to $1 \times 10^{17}$ ions/cm$^3$. In some embodiments, the p-type dopants include carbon, iron, magnesium, zinc or other suitable p-type dopants. In some embodiments, graded layer 106 includes aluminum gallium nitride ($Al_xGa_{1-x}N$), where x is the aluminum content ratio in the graded layer. In some embodiments, the graded layer includes multiple layers each having a decreased ratio x (from a layer adjoining seed layer 104 to a layer that adjoins SLS 108, or from the bottom to the top portions of the graded layer). In some embodiments, graded layer 106 has a thickness ranging from about 550 nm to about 1050 nm. If graded layer 106 is too thin, electrons from substrate 102 will be injected into channel layer 110 at high voltages, negatively impacting 2-DEG 114 or a lattice mismatch between seed layer 104 and buffer layer 108 will result in a high stress in the channel layer and increase a risk of layer separation. If graded layer 106 is too thick, material is wasted and production costs increase. In some embodiments, the graded layer is formed at a temperature ranging from about 1000° C. to about 1200° C. In some embodiments, a p-type dopant concentration of graded layer 106 increases from a bottom of the graded layer to a top of the graded layer.

In at least one example, graded layer 106 includes three graded layers. A first graded layer adjoins seed layer 104. The first graded layer includes $Al_xGa_{1-x}N$, where x ranges from about 0.7 to about 0.9. A thickness of the first graded layer ranges from about 50 nm to about 200 nm. A second graded layer is on the first graded layer. The second graded layer includes $Al_xGa_{1-x}N$, where x ranges from about 0.4 to about 0.6. A thickness of the second graded layer ranges from about 150 nm to about 250 nm. A third graded layer is on the second graded layer. The third graded layer includes $Al_xGa_{1-x}N$, where x ranges from about 0.15 to about 0.3. A thickness of the third graded layer ranges from about 350 nm to about 600 nm.

Buffer layer 108 helps to reduce lattice mismatch between graded layer 106 and channel layer 110. In some embodiments, buffer layer 108 includes GaN. In some embodiments, buffer layer 110 includes GaN doped with p-type dopants. In some embodiments, the p-type dopants include carbon, iron, magnesium, zinc or other suitable p-type dopants. In some embodiments, a concentration of the p-type dopant is greater than or equal to about $1 \times 10^{19}$ ions/cm$^3$. If the p-type dopant concentration is too low, buffer layer 108 will not be able to effectively prevent electron injection from substrate 102. If the p-type dopant concentration is too high, p-type dopants will diffuse into channel layer 110 and negatively impact 2-DEG 114. In some embodiments, buffer layer 108 is formed using an epitaxial process. In some embodiments, buffer layer 108 is formed at a temperature ranging from about 900° C. to about 1050° C. In some embodiments, buffer layer 108 has a thickness ranging from about 0.5 microns (µm) to about 2.0 µm. If buffer layer 108 is too thin, the buffer layer will not be able to effectively reduce lattice mismatch between graded layer 106 and channel layer 110. If buffer layer 108 is too thick, material is wasted without a significant beneficial impact.

Channel layer 110 is used to help form a conductive path for selectively connecting electrodes using 2-DEG 114. In some embodiments, channel layer 110 includes an indium gallium nitride material ($In_xGa_{(1-x)}N$). In some embodiments, a ratio x of indium in the indium gallium nitride material ranges from about 5 to about 15. In some embodiments, the ratio x ranges from about 5 to about 25. Including indium in channel layer 110 helps to increase a number of charge carriers available for 2-DEG 114 due to an increase in bandgap discontinuity. Increasing the number of charge carriers available for 2-DEG 114 increases a switching speed of HEMT structure 100 in comparison with other approaches which do not include indium in channel layer 110.

In some embodiments, channel layer 110 has a thickness ranging from about 5 nanometers (nm) to about 15 nm. If a thickness of channel layer 110 is too thin, the channel layer will not provide sufficient charge carriers to allow HEMT structure 100 to function properly. If the thickness of channel layer 110 is too great, material is wasted and production costs increase. In some embodiments, channel layer 110 is formed by an epitaxial process such as molecular oriented chemical vapor deposition (MOCVD), molecular beam epitaxy (MBE), hydride vapor phase epitaxy (HVPE) or another suitable epitaxial process. In some embodiments, channel layer 108 is formed at a temperature ranging from about 700° C. to about 900° C.

Active layer 112 is used to provide the band gap discontinuity with channel layer 110 to form 2-DEG 114. In some embodiments, active layer 112 includes an aluminum indium nitride material ($Al_yIn_{(1-y)}N$). In some embodiments, a ratio y of aluminum in the aluminum indium nitride material ranges from about 80 to about 95. In some embodiments, the ratio y ranges from about 70 to about 95. In some embodiments, active layer 112 includes a boron indium nitride material ($B_wIn_{(1-w)}N$). In some embodiments, a ratio w of boron in the boron indium nitride material ranges from about 70 to about 95. Including indium in active layer 112 helps to increase a number of charge carriers available for 2-DEG 114 due to an increase in bandgap discontinuity. Increasing the number of charge carriers available for 2-DEG 114 increases a switching speed of HEMT structure 100 in comparison with other approaches which do not include indium in active layer 112.

In some embodiments, active layer 112 has a thickness ranging from about 1 nm to about 3 nm. If a thickness of active layer 112 is too thin, the active layer will not provide sufficient charge carriers to allow HEMT structure 100 to function properly. If the thickness of active layer 112 is too great, material is wasted and production costs increase. In some embodiments, active layer 112 is formed by an epitaxial process such MOCVD, MBE, HVPE or another suitable epitaxial process. In some embodiments, active layer 112 is formed at a temperature ranging from about 800° C. to about 900° C.

2-DEG 114 acts as the channel for providing conductivity between electrodes. Electrons from a piezoelectric effect in active layer 112 drop into channel layer 110, and thus create a thin layer of highly mobile conducting electrons in the channel layer. By including indium in channel layer 110 and active layer 112, a charge carrier concentration of 2-DEG 114 is greater than about 1E13 cm$^{-2}$. The charge carrier concentration of 2-DEG 114 helps to increase a switching speed of HEMT structure 100.

Including indium in active layer 112 and channel layer 110 also helps to reduce lattice mismatch between the active layer and the channel layer in comparison with GaN/AlGaN structures. A lattice mismatch between GaN/AlGaN is about 28%. In contract, a lattice mismatch between InGaN/AlInN is about 12%. The reduced lattice mismatch decreases a number of dislocations within active layer 112 and channel layer 110. The reduced number of dislocations helps to provide a more consistent pathway of electrons in 2-DEG 114, which also helps to reduce switching speed of HEMT structure 100 in comparison with other approaches.

Top layer 116 also helps to provide charge carriers for 2-DEG 114 as well. In some embodiments, top layer 116 includes an aluminum gallium nitride material ($Al_zGa_{(1-z)}N$). In some embodiments, a ratio z of aluminum in the aluminum gallium nitride material ranges from about 10 to about 30. In some embodiments, top layer 116 includes a boron gallium nitride material ($B_aGa_{(1-a)}N$). In some embodiments, a ratio of boron in the boron gallium nitride material ranges from about 5 to about 20.

In some embodiments, top layer 116 has a thickness ranging from about 10 nm to about 30 nm. If a thickness of top layer 116 is too thin, the top layer will not provide sufficient charge carriers to allow HEMT structure 100 to function properly. If the thickness of top layer 116 is too great, material is wasted and production costs increase. In some embodiments, top layer 116 is formed by an epitaxial process such MOCVD, MBE, HVPE or another suitable epitaxial process. In some embodiments, top layer 116 is formed at a temperature ranging from about 1000° C. to about 1100° C.

HEMT structure 100 is normally conductive meaning that a positive voltage applied to a gate connected to the HEMT structure will reduce the conductivity between electrodes along 2-DEG 114.

Figure 2:
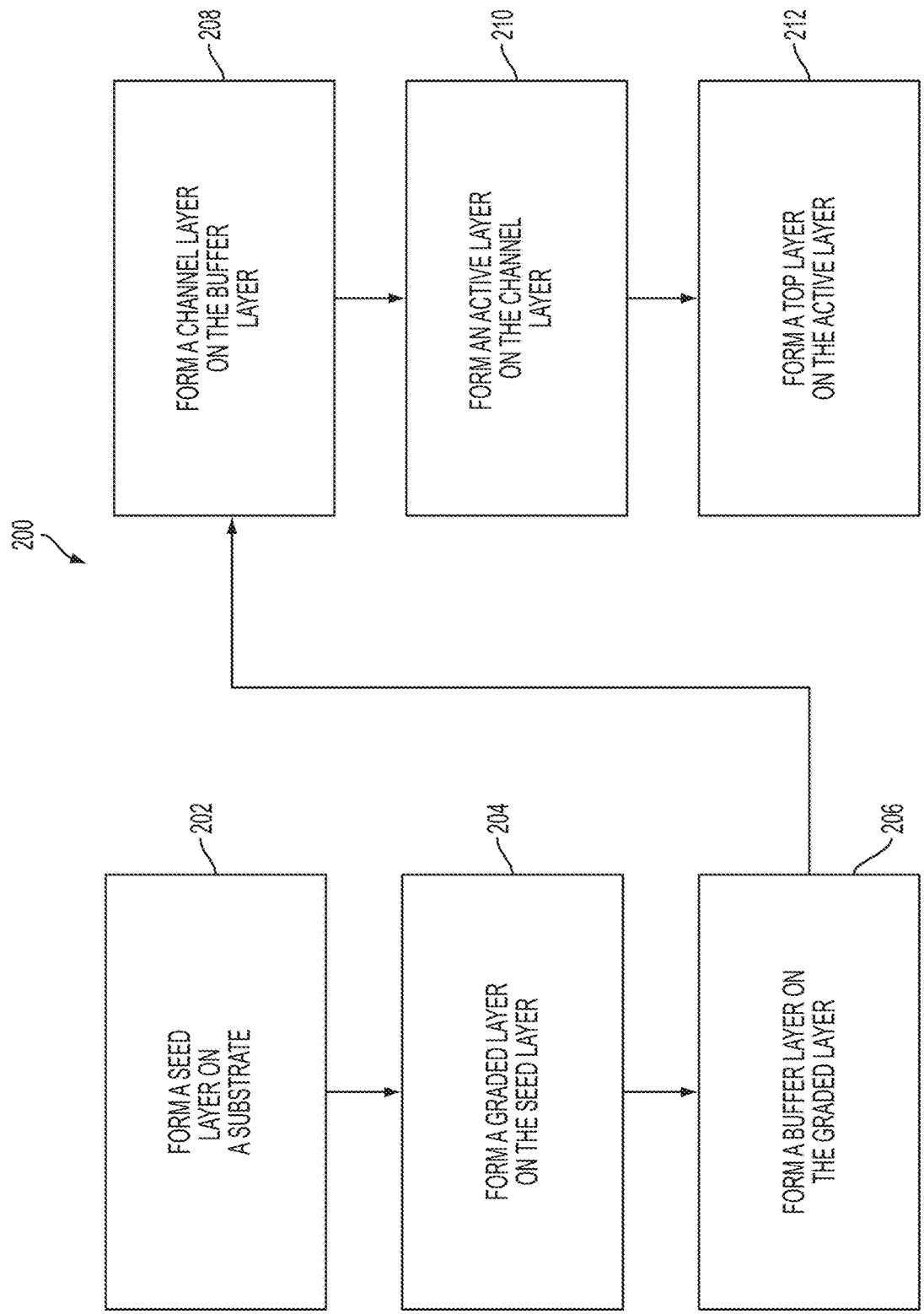
FIG. 2 is a flow chart of a method of making an HEMT structure in accordance with one or more embodiments.

FIG. 2 is a flow chart of a method 200 of making an HEMT structure in accordance with one or more embodiments. Method 200 begins with operation 202 in which a seed layer, e.g., seed layer 104 (FIG. 1), is formed on a substrate, e.g., substrate 102.

In some embodiments, the seed layer includes AlN. In some embodiments, the formation of the seed layer is performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical.

In some embodiments, the seed layer includes a low temperature (LT) seed layer and a high temperature (HT) seed layer. In some embodiments, the LT seed layer and HT seed layer include AlN. In some embodiments, the LT seed layer or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer has a thickness ranging from about 20 nm to about 80 nm. In some embodiments, the LT seed layer is formed at a temperature ranging from about 900° C. to about 1000° C.

Figure 3A:
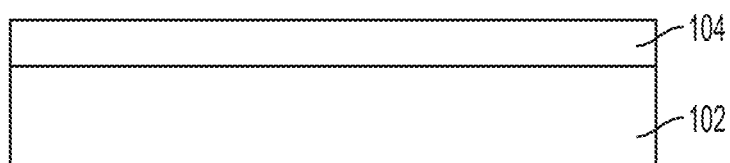
FIGS. 3A-3E are cross-sectional views of an HEMT structure at various stages of production in accordance with one or more embodiments.

FIG. 3A is a cross-sectional view of an HEMT structure following operation 202. The HEMT structure includes seed layer 104 on substrate 102. In some embodiments, seed layer 104 includes a HT seed layer on substrate 102 and an LT seed layer on the HT seed layer.

In operation 204, a graded layer, e.g., graded layer 106 (FIG. 1), is formed on the seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the graded layer is formed at a temperature ranging from about 1000° C. to about 1200° C. In some embodiments, the graded layer is doped with p-type dopants, such as carbon, iron, magnesium, zinc or other suitable p-type dopants.

In at least one embodiment, a first graded layer is formed on the seed layer. The first graded layer adjoins the seed layer. The first graded layer includes $Al_xGa_{1-x}N$, where x ranges from about 0.7 to about 0.9. A thickness of the first graded layer ranges from about 50 nm to about 200 nm. In some embodiments, the first graded layer is formed using epitaxy. In some embodiments, the first graded layer is formed at a temperature ranging from about 1000° C. to about 1200° C. A second graded layer is formed on the first graded layer. The second graded layer includes $Al_xGa_{1-x}N$, where x ranges from about 0.4 to about 0.6. A thickness of the second graded layer ranges from about 150 nm to about 250 nm. In some embodiments, the second graded layer is formed using epitaxy. In some embodiments, the second graded layer is formed at a temperature ranging from about 1000° C. to about 1200° C. A third graded layer is formed on the second graded layer. The third graded layer includes $Al_xGa_{1-x}N$, where x ranges from about 0.15 to about 0.3. A thickness of the third graded layer ranges from about 350 nm to about 600 nm. In some embodiments, the third graded layer is formed using epitaxy. In some embodiments, the third graded layer is formed at a temperature ranging from about 1000° C. to about 1200° C.

Figure 3B:
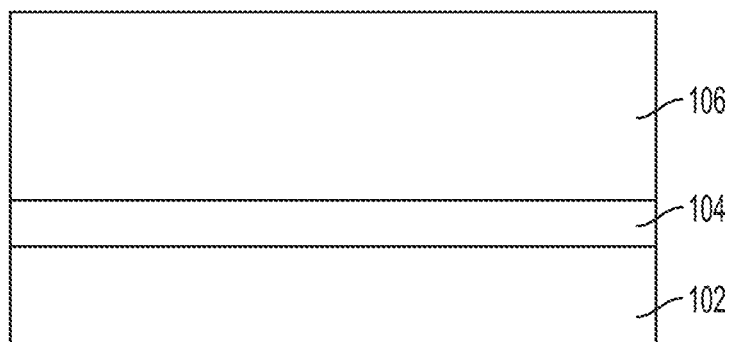

FIG. 3B is a cross-sectional view of an HEMT structure following operation 204. The HEMT structure includes graded layer 106 on seed layer 104. In some embodiments, graded layer 106 includes a plurality of discrete layers, where each layer of the plurality of discrete layers has a constant aluminum concentration. In some embodiments, graded layer 106 includes at least one layer having a varying aluminum concentration.

Returning to FIG. 2, a buffer layer is formed on the graded layer in operation 206. In some embodiments, the buffer layer includes GaN. In some embodiments, the buffer layer includes p-type dopants. In some embodiments, the P-type doping is implemented by using dopants including carbon, iron, magnesium, zinc or other suitable p-type dopants. In some embodiments, the buffer layer is formed by performing an epitaxial process. In some embodiments, the epitaxial process includes a MOCVD process, a MBE process, a HVPE process or another suitable epitaxial process. In some embodiments, the buffer layer has a thickness ranging from about 0.5 µm to about 2.0 µm. In some embodiments, the dopant concentration in the buffer layer is equal to or less than about $1 \times 10^{17}$ ions/cm$^3$. In some embodiments, the channel layer is undoped. In some embodiments, the buffer layer is formed at a temperature ranging from about 900° C. to about 1050° C. In some embodiments, the buffer layer is formed at a pressure ranging from about 50 millibar (mbar) to about 500 mbar.

Figure 3C:
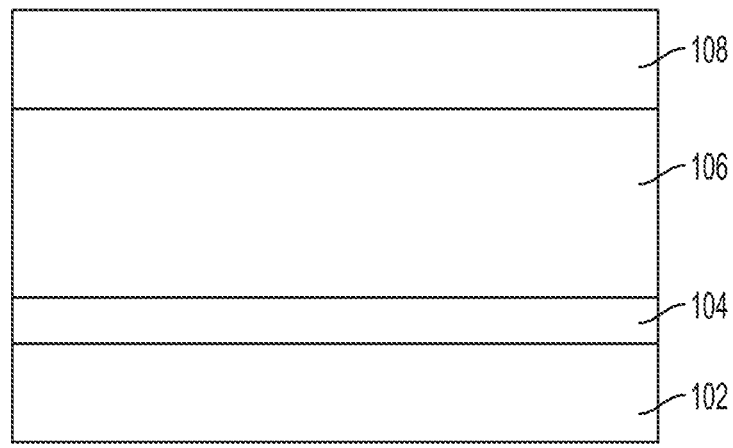

FIG. 3C is a cross-sectional view of a HEMT structure following operation 206. The HEMT structure includes buffer layer 108 on graded layer 106. In some embodiments, buffer layer 108 is doped with p-type dopants.

Returning to FIG. 2, in operation 208, a channel layer is formed on the buffer layer. The channel layer is an indium-containing layer. In some embodiments, the channel layer includes an indium gallium nitride material ($In_xGa_{(1-x)}N$). In some embodiments, a ratio x of indium in the indium gallium nitride material ranges from about 5 to about 15. In some embodiments, the ratio x ranges from about 5 to about 25.

In some embodiments, the channel layer is formed by performing an epitaxial process. In some embodiments, the epitaxial process includes a MOCVD process, a MBE process, a HVPE process or another suitable epitaxial process. In some embodiments, the channel layer has a thickness ranging from about 5 nm to about 15 nm. In some embodiments, the channel layer is doped. In some embodiments, the dopant concentration in the channel layer is equal to or less than about $1 \times 10^{17}$ ions/cm$^3$. In some embodiments, the channel layer is undoped. In some embodiments, the channel layer is formed at a temperature ranging from about 700° C. to about 900° C. In some embodiments, the channel layer is formed at a pressure ranging from about 100 mbar to about 400 mbar.

Figure 3D:
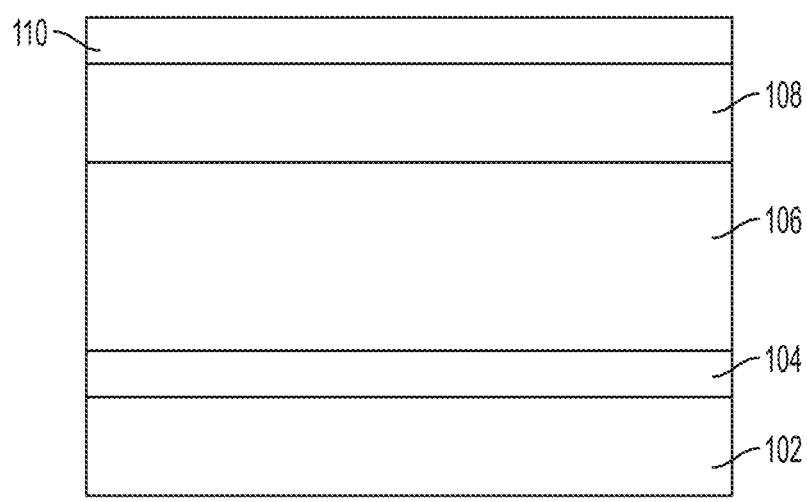

FIG. 3D is a cross-sectional view of a HEMT structure following operation 208. The HEMT structure includes channel layer 110 on buffer layer 108. Channel layer 110 is an indium-containing layer.

Returning to FIG. 2, in operation 210 an active layer is formed on the channel layer. The active layer is an indium-containing layer. In some embodiments, the active layer includes an aluminum indium nitride material ($Al_yIn_{(1-y)}N$). In some embodiments, a ratio y of aluminum in the aluminum indium nitride material ranges from about 80 to about 95. In some embodiments, the ratio y ranges from about 70 to about 95. In some embodiments, the active layer includes a boron indium nitride material ($B_wIn_{(1-w)}N$). In some embodiments, a ratio w of boron in the boron indium nitride material ranges from about 70 to about 95.

In some embodiments, the active layer has a thickness ranging from about 1 nm to about 3 nm. In some embodiments, the active layer is formed by an epitaxial process such MOCVD, MBE, HVPE or another suitable epitaxial process. In some embodiments, the active layer is formed at a temperature ranging from about 800° C. to about 900° C. In some embodiments, the active layer is formed at a pressure ranging from about 75 mbar to about 150 mbar.

Figure 3E:
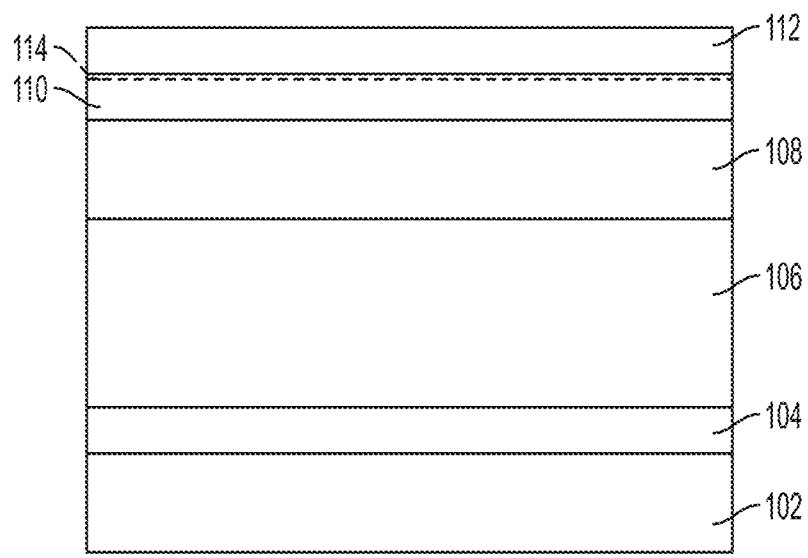

FIG. 3E is a cross-sectional view of a HEMT structure following operation 210. The HEMT structure includes active layer 112 on channel layer 110. Active layer 112 is an indium-containing layer. Due to a bandgap discontinuity between active layer 112 and channel layer 110, 2-DEG 114 is formed in channel layer.

Returning to FIG. 2, a top layer is formed over the active layer in operation 212. In some embodiments, the top layer includes an aluminum gallium nitride material ($Al_zGa_{(1-z)}N$). In some embodiments, a ratio z of aluminum in the aluminum gallium nitride material ranges from about 10 to about 30. In some embodiments, the top layer includes a boron gallium nitride material ($B_aGa_{(1-a)}N$). In some embodiments, a ratio a of boron in the boron gallium nitride material ranges from about 5 to about 20.

In some embodiments, the top layer has a thickness ranging from about 10 nm to about 30 nm. In some embodiments, the top layer is formed by an epitaxial process such MOCVD, MBE, HVPE or another suitable epitaxial process. In some embodiments, the top layer is formed at a temperature ranging from about 1000° C. to about 1100° C. In some embodiments, the top layer is formed at a pressure ranging from about 50 mbar to about 100 mbar.

Following operation 212, the HEMT structure has a structure similar to HEMT structure 100.

Figure 4:
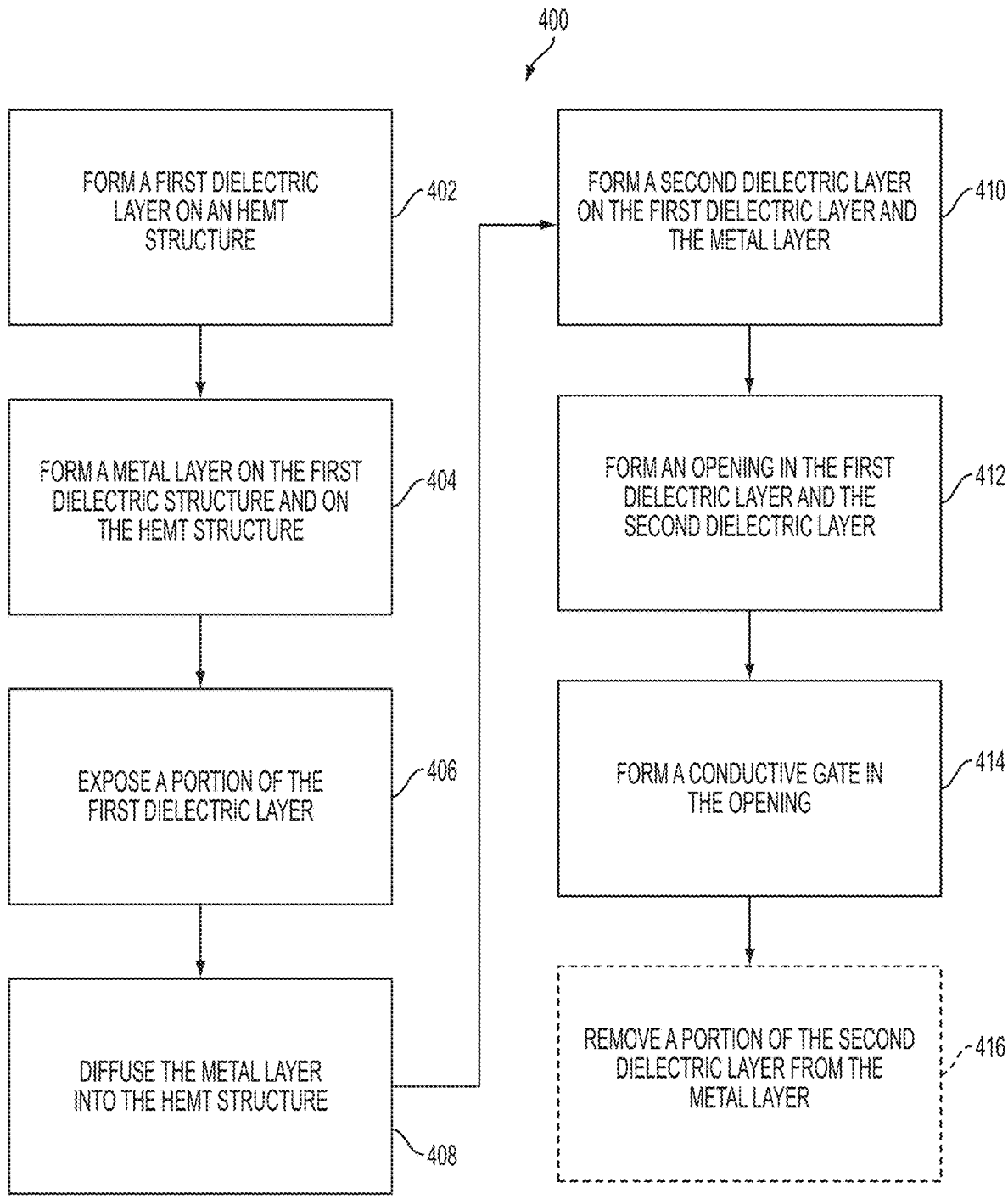
FIG. 4 is a flow chart of a method of making an HEMT in accordance with one or more embodiments.

FIG. 4 is a flow chart of a method 400 of making an HEMT in accordance with one or more embodiments. Method 400 begins with forming a first dielectric layer on an HEMT structure in operation 402. In some embodiments, the first dielectric layer includes a silicon nitride, silicon oxide, a high-k dielectric material, or another suitable dielectric material. In some embodiments, the first dielectric layer is formed by chemical vapor deposition (CVD), physical vapor deposition (PVD), an oxidation process, or another suitable formation process. In some embodiments, the first dielectric material is blanket deposited on the HEMT structure and etched to remove a portion of the first dielectric material. In some embodiments, the first dielectric material is selectively deposited on the HEMT structure.

Figure 5A:
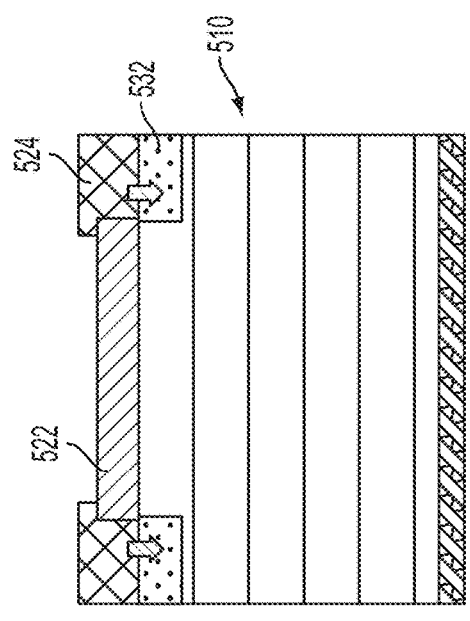

FIG. 5A is a cross-sectional view of an HEMT following operation 402 in accordance with one or more embodiments. The HEMT includes a first dielectric layer 522 over an HEMT structure 510. In some embodiments, HEMT structure 510 is similar to HEMT structure 100 (FIG. 1). First dielectric layer 522 is blanket deposited over HEMT structure 510. In some embodiments, first dielectric layer 522 is selectively deposited over HEMT structure 510.

Returning to FIG. 4, in operation 404, a metal layer is formed over the first dielectric layer and the HEMT structure. The metal layer is in contact with the HEMT structure at portions of the HEMT structure exposed by the first dielectric layer. In some embodiments where the first dielectric layer is blanket deposited over the HEMT structure, the first dielectric layer is etched to remove the portion of the first dielectric layer prior to forming the metal layer. In some embodiments, the metal layer is formed using CVD, PVD, sputtering, atomic layer deposition (ALD) or another suitable formation process. In some embodiments, the metal layer includes titanium (Ti), aluminum (Al), tungsten (W), titanium nitride (TiN) or another suitable material.

Figure 5C:
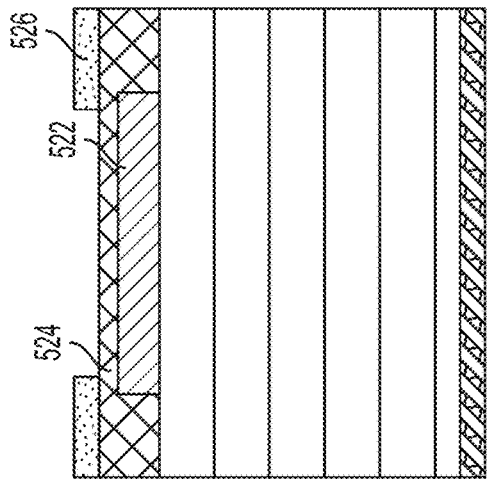
Figure 5E:
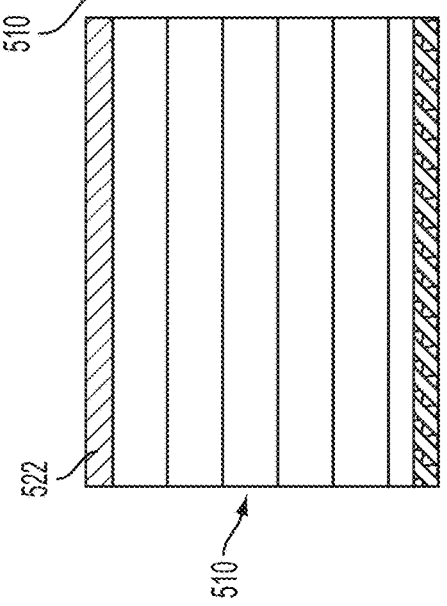
Figure 5B:
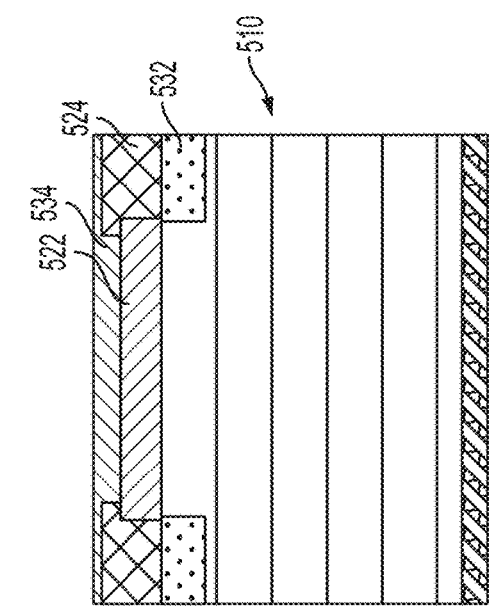

FIG. 5B is a cross-sectional view of the HEMT following operation 404 in accordance with one or more embodiments.

The HEMT includes a metal layer 524 over first dielectric layer 522 and HEMT structure 510. A portion of first dielectric layer 522 was removed between operation 402 (FIG. 5A) and operation 404. In some embodiments, the portion of first dielectric layer 522 is removed using a photolithograph/etching process, a laser drilling process or another suitable material removal process.

Returning to FIG. 4, a portion of the first dielectric layer is exposed in operation 406. The portion of the first dielectric layer is exposed by removing at least a portion of the metal layer over the first dielectric layer. In some embodiments, an entirety of the metal layer over the first dielectric layer is removed. In some embodiments, less than an entirety of the metal layer over the first dielectric layer is removed. In some embodiments, the portion of the metal layer is removed by a photolithograph/etching process, a laser drilling process or another suitable material removal process. In some embodiments, the photolithography/etching process includes forming a photoresist material over the metal layer, patterning the photoresist material and developing the patterned photoresist material. In some embodiments, the photoresist material is a positive photoresist material. In some embodiments, the photoresist material is a negative photoresist material. In some embodiments, patterning the photoresist material includes exposing the photoresist material to electromagnetic radiation such as ultraviolet (UV) radiation, extreme UV (EUV) radiation, or another suitable wavelength of radiation. In some embodiments, the photolithography/etching process includes a dry etching, a wet etching, a reactive ion etching (RIE) or another suitable etching process.

FIG. 5C is a cross-sectional view of the HEMT during operation 406 in accordance with one or more embodiments. The HEMT includes a photoresist material 526 over a portion of metal layer 524. Photoresist material 526 prevents removal of metal layer 524 below the photoresist material. Portions of metal layer 524 exposed by photoresist material 526 are removed during an etching process.

Figure 5D:
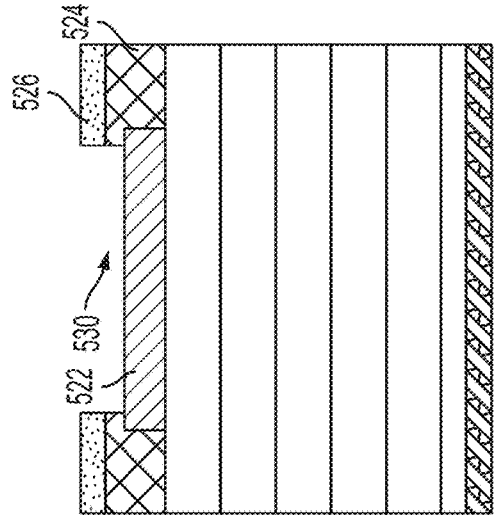

FIG. 5D is a cross-sectional view of the HEMT following operation 406 in accordance with one or more embodiments. The HEMT includes photoresist material 526 over the portion of metal layer 524 and an opening 530 in the metal layer. Opening 530 exposes at least a portion of first dielectric layer 522. In some embodiments, opening 530 exposes an entire top surface of first dielectric layer 522. In some embodiments, opening 530 exposes less than the entire top surface of first dielectric layer 522.

Photoresist material 526 is removed following operation 406. In some embodiments, photoresist material 526 is removed using an ashing process, an etching process, a planarization process, or another suitable material removal process.

Returning to FIG. 4, in operation 408, the metal layer is diffused into the HEMT structure. In some embodiments, the metal layer is diffused into the HEMT structure using an anneal process. In some embodiments, the anneal process includes a rapid thermal anneal (RTA) process, a microsecond anneal process, a laser anneal process or another suitable anneal process. Diffusing the metal layer into the HEMT structure increases electrical connection between the metal layer and a 2-DEG of the HEMT structure, so that the metal layer can function as terminals for the HEMT. In some embodiments, the diffused portions of the metal layer extend through an entirety of a top layer of the HEMT structure to contact an active layer of the HEMT structure. In some embodiments, the diffused portions of the metal layer extend through less than the entirety of the top layer and are separated from the active layer by at least a portion of the top layer.

FIG. 5E is a cross-sectional view of the HEMT following operation 408 in accordance with one or more embodiments. The HEMT includes a diffused region 532 in HEMT structure 510. Diffused region 532 increases electrical connection between a 2-DEG of HEMT structure 510 and metal layer 524. In some embodiments, diffused region 532 extends through an entirety of a top layer, e.g., top layer 116 (FIG. 1), of HEMT structure 510 and contacts an active layer, e.g., active layer 112. In some embodiments, diffused region 532 extends through less than an entirety of the top layer of HEMT structure 510 and is separated from the active layer by at least a portion of the top layer.

Returning to FIG. 4, method 400 continues with forming a second dielectric layer on the metal layer and the first dielectric layer in operation 410. In some embodiments, the second dielectric layer includes a silicon nitride, silicon oxide, a high-k dielectric material, or another suitable dielectric material. In some embodiments, the second dielectric layer includes a same material as the first dielectric layer. In some embodiments, the second dielectric layer includes a different material from the first dielectric layer. In some embodiments, the second dielectric layer is formed by CVD, PVD, an oxidation process, or another suitable formation process. In some embodiments, the second dielectric layer is formed using a same process as the first dielectric layer. In some embodiments, the second dielectric layer is formed using a different process from the first dielectric layer. In some embodiments, the second dielectric material is blanket deposited on the metal layer and the first dielectric layer and is etched to remove a portion of the second dielectric material. In some embodiments, the second dielectric material is selectively deposited on the metal layer and the first dielectric layer.

Figure 5F:
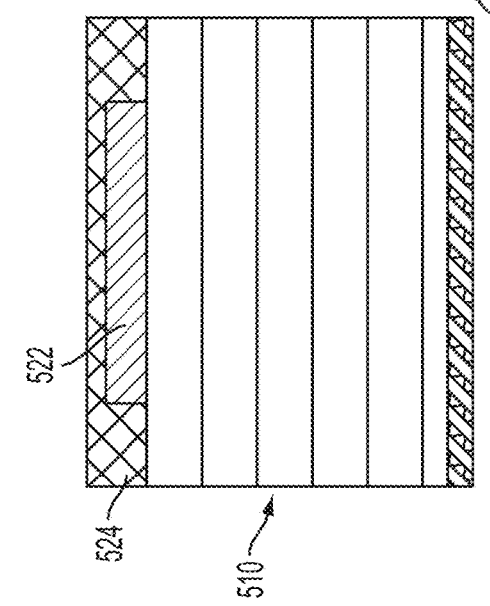

FIG. 5F is a cross-sectional view of the HEMT following operation 410 in accordance with one or more embodiments. The HEMT includes a second dielectric layer 534 over metal layer 524 and first dielectric layer 522. In some embodiments, second dielectric layer 534 includes a same material as first dielectric layer 522. In some embodiments, second dielectric layer 534 includes a different material from first dielectric layer 522. Second dielectric layer 534 is blanket deposited over metal layer 524 and first dielectric layer 522. In some embodiments, second dielectric layer 534 is selectively deposited over metal layer 524 and first dielectric layer 522.

Returning to FIG. 4, an opening is formed in the first dielectric layer and the second dielectric layer in operation 412. The opening is formed by removing a portion of the first dielectric layer and the second dielectric layer to expose a portion of the HEMT structure. In some embodiments, the opening is formed by a photolithograph/etching process, a laser drilling process or another suitable material removal process. In some embodiments, the opening is formed using a same process as in operation 406. In some embodiments, the opening is formed using a different process from the process in operation 406.

FIG. 5G is a cross-sectional view of the HEMT during operation 412 in accordance with one or more embodiments. The HEMT includes a photoresist material 536 over a portion of second dielectric layer 534. Photoresist material 536 prevents removal of second dielectric layer 534 below the photoresist material. Portions of second dielectric layer 534 exposed by photoresist material 536 are removed during an etching process.

FIG. 5H is a cross-sectional view of the HEMT following operation 412 in accordance with one or more embodiments. The HEMT includes photoresist material 536 over the portion of second dielectric layer 534 remaining following an etching process and an opening 540 in the second dielectric layer and first dielectric layer 522. Opening 540 exposes a portion of HEMT structure 510.

Photoresist material 536 is removed following operation 412. In some embodiments, photoresist material 536 is removed using an ashing process, an etching process, a planarization process, or another suitable material removal process. In some embodiments, photoresist material 536 is removed using a same removal process as for photoresist material 526. In some embodiments, photoresist material 536 is removed using a different removal process from the removal of photoresist material 526.

Returning to FIG. 4, in operation 414, a conductive gate is formed in the opening. The conductive gate is electrically connected with the HEMT structure. In some embodiments, the conductive gate includes polysilicon, a metal, a conductive polymer or another suitable conductive material. In some embodiments, the conductive gate includes a same material as the metal layer. In some embodiments, the conductive gate includes a different material from the metal layer. In some embodiments, the conductive gate is formed by PVD, sputtering, ALD, electroplating or another suitable formation process. In some embodiments, a process used to form the conductive gate is a same process as used to form the metal layer. In some embodiments, the process used to form the conductive gate is a different process from that used to form the metal layer.

FIG. 5I is a cross-sectional view of the HEMT during operation 414 in accordance with one or more embodiments. The HEMT includes a conductive gate 542 filling opening 540. Conductive gate 542 contacts HEMT structure 510. Conductive gate 542 is blanket deposited over second dielectric layer 534. In some embodiments, conductive gate 542 is selectively deposited over second dielectric layer 534.

FIG. 5J is a cross-sectional view of the HEMT following operation 414 in accordance with one or more embodiments. The HEMT includes conductive gate 542 filling opening 540. In comparison with FIG. 5I, a portion of conductive gate 542 of FIG. 5J over second dielectric layer 534 is removed. In some embodiments, the portion of conductive gate 542 is removed by a photolithography/etching process, a laser drilling process or another suitable material removal process. In some embodiments where conductive gate 542 is selectively deposited, cross-sectional view FIG. 5I does not occur.

Returning to FIG. 4, a portion of the second dielectric layer over the metal layer is removed in optional operation 416. In some embodiments, operation 416 is omitted if the second dielectric layer is selectively deposited over the metal layer in operation 410. In some embodiments, the portion of the second dielectric layer is removed by a photolithograph/etching process, a laser drilling process or another suitable material removal process. In some embodiments, the removal process of operation 416 is a same process as at least one operation 406 or operation 412. In some embodiments, the removal process of operation 416 is a different process from the process in operation 406 or operation 412.

FIG. 5K is a cross-sectional view of the HEMT during operation 416 in accordance with one or more embodiments. The HEMT includes a photoresist material 544 over a portion of second dielectric layer 534. Photoresist material 544 prevents removal of second dielectric layer 534 below the photoresist material. Portions of second dielectric layer 534 exposed by photoresist material 544 are removed during an etching process.

FIG. 5L is a cross-sectional view of the HEMT following operation 416 in accordance with one or more embodiments. The HEMT includes portions of second dielectric layer 534 removed to expose a top surface of metal layer 524.

Photoresist material 544 is removed following operation 416. In some embodiments, photoresist material 544 is removed using an ashing process, an etching process, a planarization process, or another suitable material removal process. In some embodiments, photoresist material 544 is removed using a same removal process as for at least one of photoresist material 526 or photoresist material 536. In some embodiments, photoresist material 544 is removed using a different removal process from the removal of at least one of photoresist material 526 or photoresist material 536.

Figure 6:
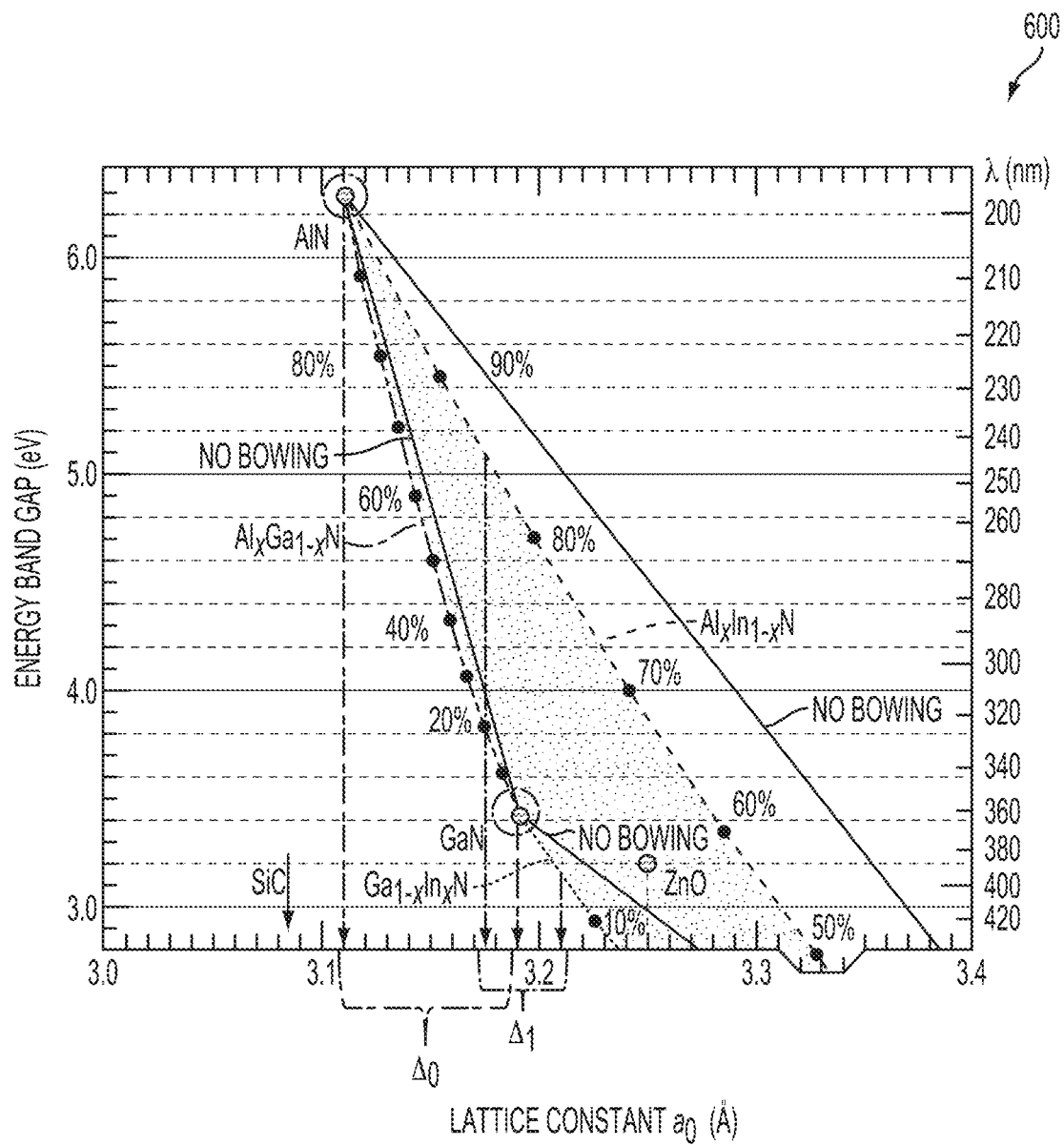
FIG. 6 is a graph of lattice constant versus bandgap energy for III-V nitride materials.

FIG. 6 is a graph 600 of lattice constant versus bandgap energy for III-V nitride materials. Graph 600 indicates a first lattice mismatch $\Delta_0$ between AlN and GaN is approximately 28%. Graph 600 further indicates a second lattice mismatch between an aluminum indium nitride material and an indium gallium nitride material of approximately 12%. The decrease in the lattice mismatch helps to reduce a number of dislocations in a channel layer, e.g. channel layer 110 (FIG. 1), of the HEMT structure. The reduced number of dislocations permits charge to be transferred between terminals of an HEMT along a 2-DEG, e.g., 2-DEG 114, more freely in comparison with an AlN/GaN structure.

Figure 7:
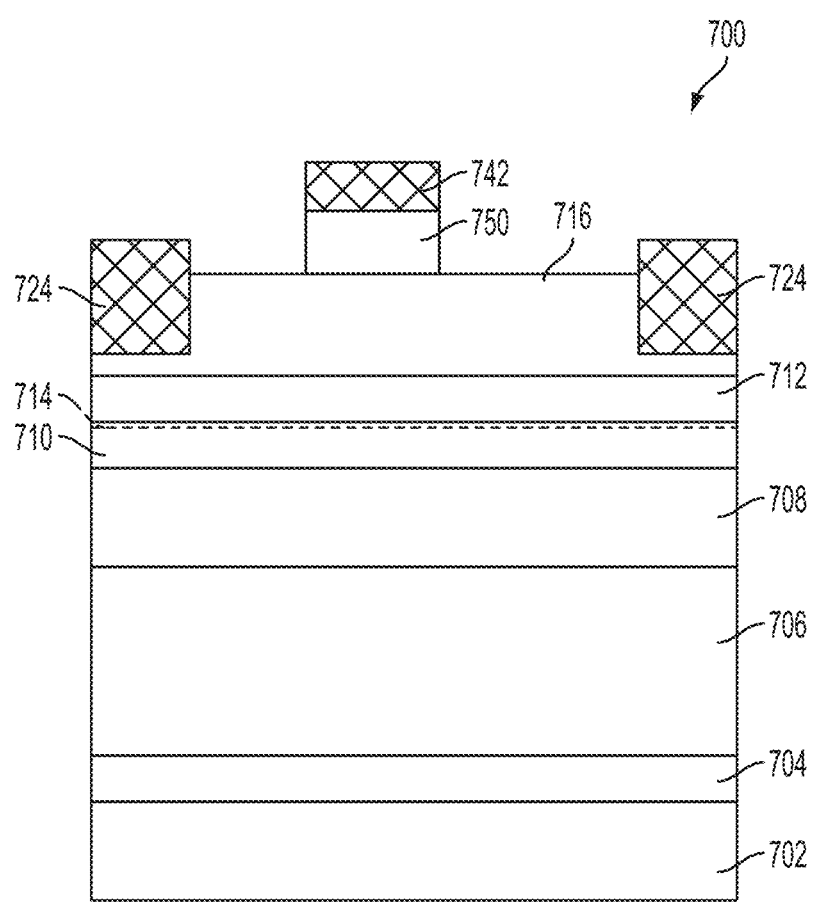
FIG. 7 is a cross-sectional view of an enhanced HEMT (E-HEMT) in accordance with one or more embodiments.

FIG. 7 is a cross-sectional view of an enhanced HEMT (E-HEMT) 700 in accordance with one or more embodiments. E-HEMT 700 is similar to HEMT structure 100. Similar elements have a same reference number as HEMT 100 increased by 600. In comparison with HEMT structure 100, E-HEMT 700 includes a semiconductor material 750 between a gate 742 and top layer 716. In some embodiments, semiconductor material 750 is a group III-V semiconductor material such as GaN, AlGaN, InGaN, or another suitable group III-V semiconductor material. In some embodiments, semiconductor material 750 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants. In comparison with HEMT structure 100, E-HEMT 700 is normally non-conductive between terminals 724. As a positive voltage is applied to gate 742, E-HEMT 700 provides an increased conductivity between terminals 724.

Figure 8:
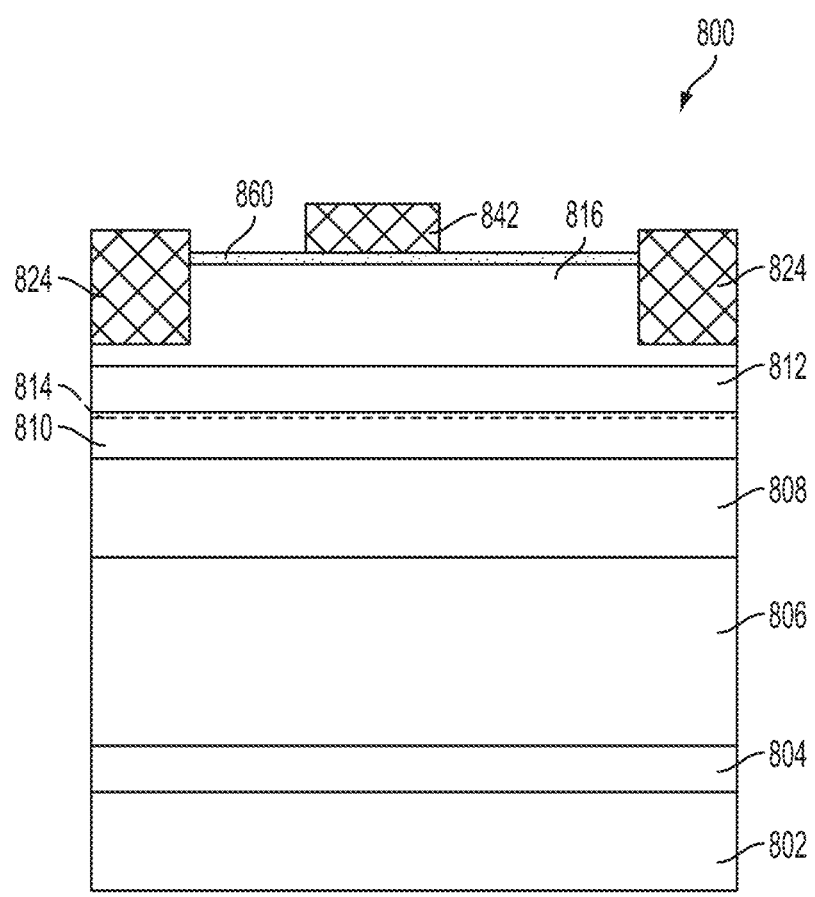
FIG. 8 is a cross-sectional view of a depletion metal-insulator-semiconductor field-effect transistor (D-MISFET) in accordance with one or more embodiments.

FIG. 8 is a cross-sectional view of a depletion metal-insulator-semiconductor field-effect transistor (D-MISFET) 800 in accordance with one or more embodiments. D-MISFET 800 is similar to HEMT structure 100. Similar elements have a same reference number as HEMT structure 100 increased by 700. In comparison with HEMT structure 100, D-MISFET 800 includes a dielectric layer 860 between gate 842 and top layer 816. In some embodiments, dielectric layer 860 includes silicon dioxide. In some embodiments, dielectric layer 860 includes a high-k dielectric layer having a dielectric constant greater than a dielectric constant of silicon dioxide. Similar to HEMT structure 100, D-MISFET 800 is normally conductive between terminals 824. As a positive voltage is applied to gate 842, D-MISFET 800 provides a decreased conductivity between terminals 842.

Figure 9:
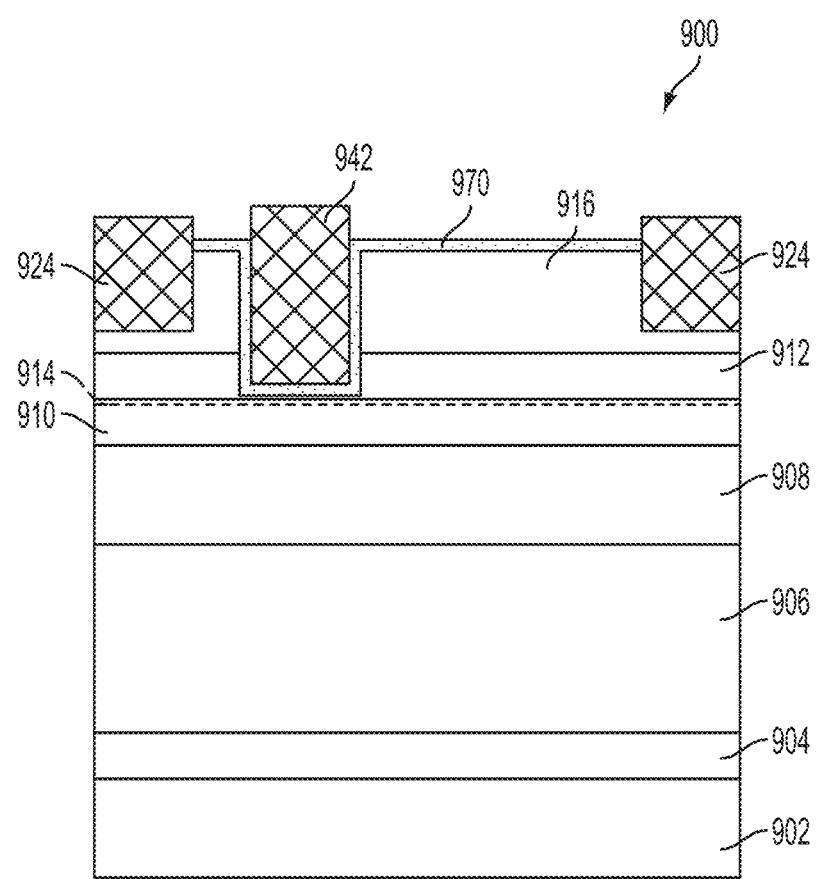
FIG. 9 is a cross-sectional view of an enhanced metal-insulator-semiconductor field-effect transistor (E-MISFET) in accordance with one or more embodiments.

FIG. 9 is a cross-sectional view of an enhanced metal-insulator-semiconductor field-effect transistor (E-MISFET) 900 in accordance with one or more embodiments. E-MISFET 900 is similar to HEMT structure 100. Similar elements have a same reference number as HEMT structure 100 increased by 800. In comparison with HEMT structure 100, E-MISFET 900 gate 942 is in contact with channel layer 910 without intervening active layer 912 or top layer 916. E-MISFET 900 further includes a dielectric layer 970 between gate 942 and channel layer 910. Dielectric layer 970 also separates sidewalls of gate 942 and active layer 912 and top layer 916. In some embodiments, dielectric layer 970 includes silicon dioxide. In some embodiments, dielectric layer 970 includes a high-k dielectric layer having a dielectric constant greater than a dielectric constant of silicon dioxide. In comparison with HEMT structure 100, E-MISFET 900 is normally non-conductive between terminals 924. As a positive voltage is applied to gate 942, E-MISFET 900 provides an increased conductivity between terminals 924.

Aspects of the present disclosure relate to a high electron mobility transistor (HEMT) which includes a substrate; a first semiconductor layer over the substrate; a second semiconductor layer over the first semiconductor layer, wherein the second semiconductor layer has a band gap discontinuity with the first semiconductor layer, and at least one of the first semiconductor layer or the second semiconductor layer comprises indium; a top layer over the second semiconductor layer; a metal layer over and extending into the top layer, wherein the top layer separates the metal layer from the second semiconductor layer; a gate electrode over the top layer; a third semiconductor layer between the gate electrode and the top layer, wherein a sidewall of the third semiconductor layer is separated from a sidewall of the metal layer; and a source and a drain on opposite sides of the gate electrode, wherein the top layer extends continuously from below the source, below the gate electrode, and to below the drain. In some embodiments, the first semiconductor layer comprises an $In_xGa_{(1-x)}N$ material. In some embodiments, x ranges from about 0.05 to about 0.15. In some embodiments, the second semiconductor layer comprises an $Al_yIn_{(1-y)}N$ material. In some embodiments, y ranges from about 0.80 to about 0.90. In some embodiments, the first semiconductor layer further comprises a two-dimensional electron gas (2 DEG). In some embodiments, a charge carrier concentration in the 2-DEG is greater than about 1E13 cm$^{-2}$. In some embodiments, the second semiconductor layer comprise a $B_wIn_{(1-w)}N$ material. In some embodiments, w ranges from about 0.70 to about 0.95.

Aspects of the present disclosure relate to a high electron mobility transistor (HEMT) which includes: a substrate; a buffer layer over the substrate; a first semiconductor layer over the buffer layer; a two-dimensional electron gas (2-DEG) in the first semiconductor layer; an second semiconductor layer over the first semiconductor layer, wherein a thickness of the second semiconductor layer ranges from 1 nanometer (nm) to 3 nm; a top layer over the second semiconductor layer, wherein at least one of the first semiconductor layer or the second semiconductor layer comprises indium; a gate electrode embedded in and surrounded by the top layer and the second semiconductor layer; a conformal dielectric layer over the top layer and directly contacting both a bottom of the gate electrode and a top surface of the first semiconductor layer; and a metal layer over the top layer, wherein a doped region of the top layer separates the metal layer from the second semiconductor layer, and a dimension of the doped region in a first direction is less than a dimension of the top layer in the first direction. In some embodiments, the first semiconductor layer comprises an $In_xGa_{(1-x)}N$ material, and the second semiconductor layer comprises an $Al_yIn_{(1-y)}N$ material. In some embodiments, x ranges from about 0.05 to about 0.15. In some embodiments, y ranges from about 0.80 to about 0.90. In some embodiments, the first semiconductor layer comprises an $In_xGa_{(1-x)}N$ material, and the second semiconductor layer comprises a $B_wIn_{(1-w)}N$ material. In some embodiments, x ranges from about 0.05 to about 0.15. In some embodiments, w ranges from about 0.70 to about 0.95. In some embodiments, the buffer layer comprises gallium nitride (GaN). In some embodiments, the top layer comprises an $Al_bGa_{(1-b)}N$ material, wherein b ranges from 0.10 to 0.30. In some embodiments, a charge carrier concentration in the 2-DEG is greater than about 1E13 cm$^{-2}$.

Aspects of the present disclosure relate to a method of making a high electron mobility transistor (HEMT), which includes operations of: forming a channel layer over a substrate, wherein the channel layer comprises an $In_xGa_{1-x}N$ material; forming an active layer over the channel layer, wherein the active layer is selected from the group consisting of an $Al_yIn_{(1-y)}N$ material and a $B_wIn_{(1-w)}N$ material, and wherein 0.7≤y≤0.95 and 0.7≤w≤0.95; forming a top layer over the active layer, wherein the top layer comprises a $B_aGa_{(1-a)}N$ material, and a>0; depositing a metal layer over the top layer; and diffusing the metal layer into the top layer to form a doped region in the top layer. The method also includes operations related to etching a first opening through the top layer to expose a top surface of the active layer; etching the active layer through the first opening to form a second opening extending through the top layer and the active layer and exposing a top surface of the channel layer; depositing a dielectric liner in the second opening and on the top surface of the channel layer; and depositing a gate electrode on the dielectric liner in the opening wherein the gate electrode is spaced from the metal layer and wherein the gate electrode is embedded in the active layer and surrounded by the top layer and the dielectric liner. It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A high electron mobility transistor (HEMT) comprising:
    a substrate;
    a first semiconductor layer over the substrate;
    a second semiconductor layer over the first semiconductor layer, wherein the second semiconductor layer has a band gap discontinuity with the first semiconductor layer, and at least one of the first semiconductor layer or the second semiconductor layer comprises indium;
    a top layer over the second semiconductor layer;
    a metal layer over and extending into the top layer, wherein the top layer separates the metal layer from the second semiconductor layer;
    a gate electrode over the top layer;
    a third semiconductor layer between the gate electrode and the top layer, wherein a sidewall of the third semiconductor layer is separated from a sidewall of the metal layer; and
    a source and a drain on opposite sides of the gate electrode, wherein the top layer extends continuously from below the source, below the gate electrode, and to below the drain.

2. The HEMT of claim 1, wherein the first semiconductor layer comprises an $In_xGa_{(1-x)}N$ material.

3. The HEMT of claim 2, wherein x ranges from about 0.05 to about 0.15.

4. The HEMT of claim 1, wherein the second semiconductor layer comprises an $Al_yIn_{(1-y)}N$ material.

5. The HEMT of claim 4, wherein y ranges from about 0.80 to about 0.90.

6. The HEMT of claim 1, further comprising a two-dimensional electron gas (2-DEG) in the first semiconductor layer.

7. The HEMT of claim 6, wherein a charge carrier concentration in the 2-DEG is greater than about $1E13\ cm^{-2}$.

8. The HEMT of claim 1, wherein the second semiconductor layer comprise a $B_wIn_{(1-w)}N$ material.

9. The HEMT of claim 8, wherein w ranges from about 0.70 to about 0.95.

10. A high electron mobility transistor (HEMT) comprising:
    a substrate;
    a buffer layer over the substrate;
    a first semiconductor layer over the buffer layer;
    a two-dimensional electron gas (2-DEG) in the first semiconductor layer;
    an second semiconductor layer over the first semiconductor layer, wherein a thickness of the second semiconductor layer ranges from 1 nanometer (nm) to 3 nm;
    a top layer over the second semiconductor layer, wherein at least one of the first semiconductor layer or the second semiconductor layer comprises indium;
    a gate electrode embedded in and surrounded by the top layer and the second semiconductor layer;
    a conformal dielectric layer over the top layer and directly contacting both a bottom of the gate electrode and a top surface of the first semiconductor layer; and
    a metal layer over the top layer, wherein a doped region of the top layer separates the metal layer from the second semiconductor layer, and a dimension of the doped region in a first direction is less than a dimension of the top layer in the first direction.

11. The HEMT of claim 10, wherein the first semiconductor layer comprises an $In_xGa_{(1-x)}N$ material, and the second semiconductor layer comprises an $Al_yIn_{(1-y)}N$ material.

12. The HEMT of claim 11, wherein x ranges from about 0.05 to about 0.15.

13. The HEMT of claim 11, wherein y ranges from about 0.80 to about 0.90.

14. The HEMT of claim 10, wherein the first semiconductor layer comprises an $In_xGa_{(1-x)}N$ material, and the second semiconductor layer comprises a $B_wIn_{(1-w)}N$ material.

15. The HEMT of claim 14, wherein x ranges from about 0.05 to about 0.15.

16. The HEMT of claim 14, wherein w ranges from about 0.70 to about 0.95.

17. The HEMT of claim 10, wherein the buffer layer comprises gallium nitride (GaN).

18. The HEMT of claim 10, wherein the top layer comprises an $Al_bGa_{(1-b)}N$ material, wherein b ranges from 0.10 to 0.30.

19. The HEMT of claim 10, wherein a charge carrier concentration in the 2-DEG is greater than about $1E13\ cm^{-2}$.

20. A method of making a high electron mobility transistor (HEMT), the method comprising:
    forming a channel layer over a substrate, wherein the channel layer comprises an $In_xGa_{(1-x)}N$ material;
    forming an active layer over the channel layer, wherein the active layer is selected from the group consisting of an $Al_yIn_{(1-y)}N$ material and a $B_wIn_{(1-w)}N$ material, and wherein $0.7 \leq y \leq 0.95$ and $0.7 \leq w \leq 0.95$;
    forming a top layer over the active layer, wherein the top layer comprises a $B_aGa_{(1-a)}N$ material, and a>0;
    depositing a metal layer over the top layer; and
    diffusing the metal layer into the top layer to form a doped region in the top layer;
    etching a first opening through the top layer to expose a top surface of the active layer;
    etching the active layer through the first opening to form a second opening extending through the top layer and the active layer and exposing a top surface of the channel layer;
    depositing a dielectric liner in the second opening and on the top surface of the channel layer; and
    depositing a gate electrode on the dielectric liner in the opening wherein the gate electrode is spaced from the metal layer and wherein the gate electrode is embedded in the active layer and surrounded by the top layer and the dielectric liner.

* * * * *